United States Patent
Tamura et al.

(10) Patent No.: US 9,762,026 B2
(45) Date of Patent: Sep. 12, 2017

(54) OPTICAL MODULE

(71) Applicant: Oclaro Japan, Inc., Kanagawa (JP)

(72) Inventors: Kohichi Robert Tamura, Kanagawa (JP); Takanori Suzuki, Tokyo (JP); Mitsuo Akashi, Kanagawa (JP); Shigehisa Tanaka, Tokyo (JP); Hiroaki Inoue, Saitama (JP); Hiroyasu Sasaki, Kanagawa (JP)

(73) Assignee: OCLARO JAPAN, INC., Kanagawa (JP)

( * ) Notice: Subject to any disclaimer, the term of this patent is extended or adjusted under 35 U.S.C. 154(b) by 0 days.

(21) Appl. No.: 15/240,022

(22) Filed: Aug. 18, 2016

(65) Prior Publication Data

US 2017/0054269 A1 Feb. 23, 2017

(30) Foreign Application Priority Data

Aug. 21, 2015 (JP) ................. 2015-164254

(51) Int. Cl.
*G02B 6/12* (2006.01)
*H01S 5/022* (2006.01)
(Continued)

(52) U.S. Cl.
CPC ............ *H01S 5/02248* (2013.01); *G02B 6/34* (2013.01); *H01S 5/0064* (2013.01);
(Continued)

(58) Field of Classification Search
None
See application file for complete search history.

(56) References Cited

U.S. PATENT DOCUMENTS 5,814,870 A * 9/1998 Spaeth ................ H01L 31/0203
257/433
6,213,650 B1 * 4/2001 Moriyama ........... G02B 6/4214
385/88

(Continued)

FOREIGN PATENT DOCUMENTS

JP 2014-110257 A 6/2014

OTHER PUBLICATIONS

Takanori Suzuki, et al, "A Light Source Using 1.3-um Lens-Integrated Surface-Emitting Laser for Silicon Platforms," IEEE Photonics Technology Letters, vol. 26, No. 11, Jun. 1, 2014, pp. 1089-1091.

*Primary Examiner* — Sung Pak
(74) *Attorney, Agent, or Firm* — Mattingly & Malur, PC

(57) ABSTRACT

An optical module includes a semiconductor optical device in which an active layer located at one side, an electrode located at the same side, and a mirror that reflects light toward the side opposite the electrode are monolithically integrated, a sub-mount having one surface on which a first wiring pattern is formed, a substrate in which an optical waveguide and a grating coupler are formed in a surface layer of the substrate, a spacer having an upper surface on which a second wiring pattern is formed, and a wire. The sub-mount is mounted on the spacer. The first wiring pattern on the sub-mount faces part of the second wiring pattern on the spacer and is electrically connected thereto. The second wiring pattern on the spacer includes a pad being disposed in a region exposed from the sub-mount and being bonded to the wire.

9 Claims, 7 Drawing Sheets

(51) Int. Cl.
*G02B 6/34* (2006.01)
*H01S 5/183* (2006.01)
*H01S 5/00* (2006.01)
*H01S 5/026* (2006.01)
*G02B 6/42* (2006.01)

(52) U.S. Cl.
CPC ........ *H01S 5/0261* (2013.01); *H01S 5/02276* (2013.01); *H01S 5/02288* (2013.01); *H01S 5/02292* (2013.01); *H01S 5/18388* (2013.01); *G02B 6/4214* (2013.01); *G02B 6/4271* (2013.01)

(56) References Cited

U.S. PATENT DOCUMENTS

| | | | |
|---|---|---|---|
| 6,856,717 B2* | 2/2005 | Kilian | G02B 6/4214 385/15 |
| 8,168,939 B2 | 5/2012 | Mack et al. | |
| 9,105,807 B2* | 8/2015 | Freund | H01L 33/20 |
| 2007/0160322 A1* | 7/2007 | Ide | G02B 6/4214 385/24 |
| 2014/0153605 A1 | 6/2014 | Arimoto et al. | |

* cited by examiner

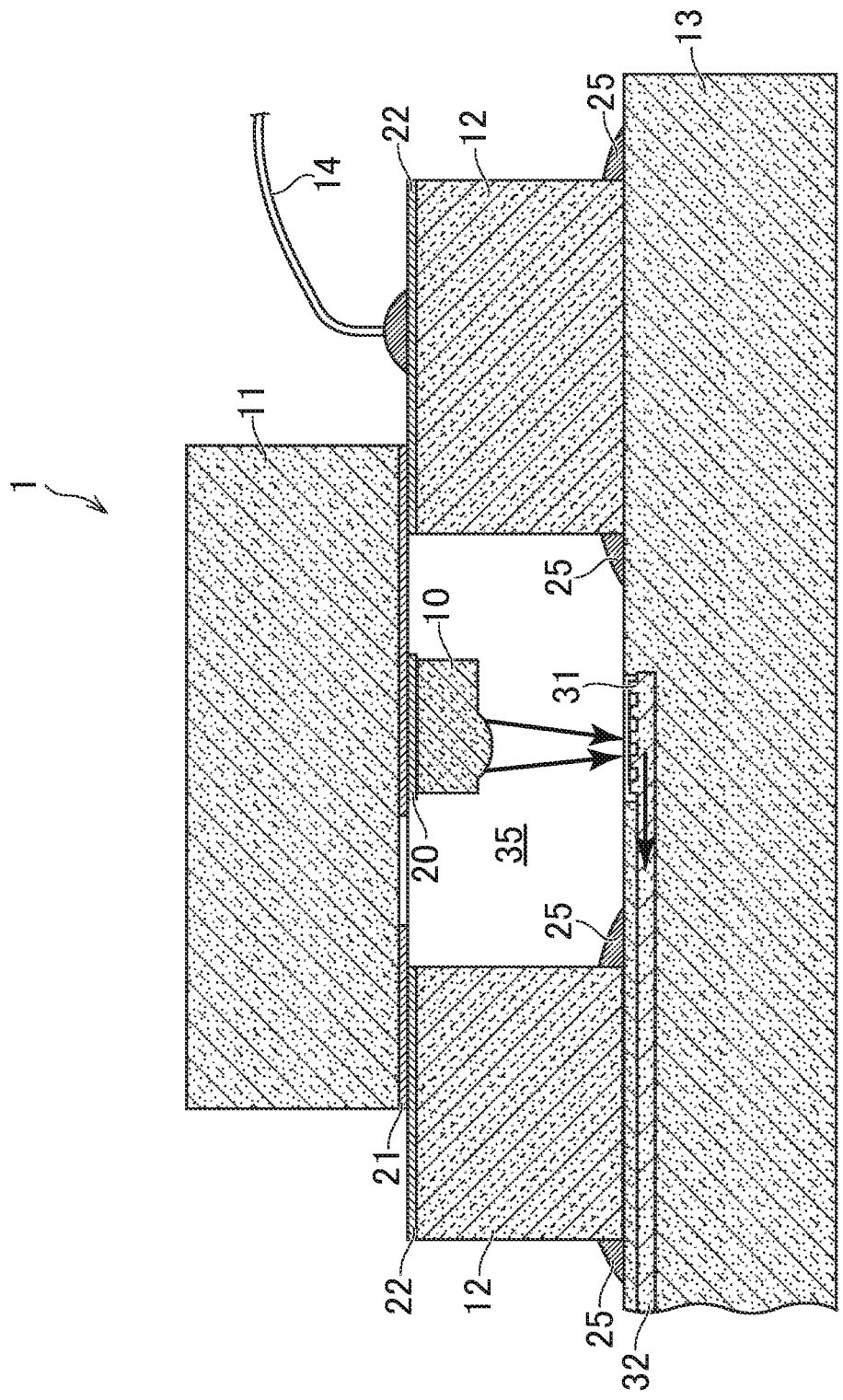

US 9,762,026 B2

OPTICAL MODULE

CROSS-REFERENCE TO RELATED APPLICATION

The present application claims priority from Japanese application JP 2015-164254, filed on Aug. 21, 2015, the content of which is hereby incorporated by reference into this application.

BACKGROUND OF THE INVENTION

1. Field of the Invention

The present invention relates to an optical module, and particularly to an optical module including a semiconductor optical device in which a laser section and a mirror are monolithically integrated.

2. Description of the Related Art

To achieve size reduction and cost reduction, decrease in power consumption, and increase in capacity of an optical module, it is desired to improve an optical waveguide technology for integrating a large number of optical functions in a single device. To this end, a variety of types of research and development on silicon photonics (hereinafter referred to as SiP) technologies have been recently conducted. The SiP technology is a technology extended from a CMOS process developed for an electrical integrated circuit to formation of an optical waveguide circuit. The SiP technology allows a large number of optical functions to be integrated in optical interconnection. However, to further improve the SiP technology, it is desirable to form a light source (semiconductor laser) on a silicon substrate in such a way that the light source is integrated with the substrate. Materials that can be grown in the form of crystal on a silicon substrate and allows laser oscillation have, however, not been known at a practical level, and no laser source has therefore so far been integrated on a silicon substrate. It is therefore necessary to separately provide a light source, and a technology for coupling an InGaAs semiconductor laser with an SiP device in a hybrid implementation process is, for example, used. The SiP device used herein is a device in which an optical waveguide circuit is formed on an Si substrate. In the formation process, it has been known that the coupling between the semiconductor laser and the SiP device is achieved by a grating coupler formed in a surface layer of the SiP device. The grating coupler is an optical part that uses Bragg reflection to convert the propagating direction of light with which the surface is irradiated into a direction in a plane of the device, focusing the light, and efficiently coupling the focused light with an optical waveguide extending in the plane. Use of the grating coupler allows evaluation of the optical device in a wafer state and is therefore suitable for volume production and cost reduction.

SUMMARY OF THE INVENTION

U.S. Pat. No. 8,168,939 discloses the light source that can be optically and directly connected to the CMOS chip. In the light source shown in FIG. 3A of U.S. Pat. No. 8,168,939, four optical parts in total, the laser, the ball lens, the isolator, and the reflection mirror, are integrated in the hermetically sealable package and laterally aligned with one another. The lateral arrangement can ensure the optical distance over which light emitted from the laser travels until the light enters the CMOS chip but undesirably results in an increase in the dimension of the light source. Further, to align the optical axes of the optical parts, such as the laser and the ball lens, with one another, the number of manufacturing steps undesirably increases. For example, as shown in FIG. 3H of U.S. Pat. No. 8,168,939, to adjust the height of the optical axes, the precision mesa 303 is disposed on the optical bench 301, and the laser 307 is disposed on the precise mesa 303. Further, to adjust the height of the optical axes, the hole is formed in the optical bench 301, and the ball lens 309 is disposed in the hole. Needless to say, optical parts and manufacturing steps necessary for the alignment of the optical axes of the optical parts result in an increase in cost.

Among a variety of semiconductor lasers having been proposed to achieve the grating-coupler-based coupling, the lens integrated surface emitting laser (LISEL) is disclosed as a semiconductor optical device having the simplest configuration in T. Suzuki, et al, "A Light Source Using 1.3-μm Lens-Integrated Surface-Emitting Laser for Silicon Platforms," IEEE Photonics Technology Letters, Vol. 26, No. 11, Jun. 1, 2014, pp. 1089-1091. The LISEL is a semiconductor optical device in which a semiconductor laser, a lens, and a mirror are integrated on a substrate. The semiconductor laser provided in the LISEL, for example has the same structure as that of a DFB laser (distributed feedback laser) of related art. For example, in the case of the LISEL disclosed by T. Suzuki, et al, when the resonator length of the semiconductor laser is 150 μm (when wavelength is 1.3 μm), and the lens having a radius of 110 μm is provided, a spot diameter of 20 μm is obtained. Since the spot diameter is close to an optimum condition of a grating coupler, low coupling loss (4.5 dB) is achieved. Further, since the device length of the semiconductor optical device is 400 μm, size reduction is achieved as compared with the case where a plurality of optical parts are combined with one another, such as the light source described in FIG. 3A of U.S. Pat. No. 8,168,939.

To manufacture an optical module including a LISEL and an SiP device, it is conceivable to employ a method for directly fixing the LISEL to the surface of the SiP device. The thus formed optical module is called an optical module according to Comparative Example.

FIG. 7 is a cross-sectional view of the optical module according to Comparative Example of the invention. The semiconductor optical device shown in FIG. 7 is an LISEL directly fixed to a surface of an Si substrate 113 (silicon substrate). A grating coupler 131 and an optical waveguide 132 are formed in a surface layer of the Si substrate 113, and the entire structure forms an SiP device. Since a semiconductor optical device 110 is fixed to a surface of the Si substrate 113, an electrode 120 is formed on a lower surface of the semiconductor optical device 110, and the semiconductor optical device is fixed to the Si substrate 113 via the electrode 120. In the optical module according to Comparative Example, however, it is difficult to ensure the optical distance over which light emitted from the semiconductor optical device 110 travels until the light enters the Si substrate 113.

JP 2014-110257 A discloses, in FIGS. 6A and 6B, the optical apparatus including the semiconductor laser device 1, the silicon substrate 21, the laser sub-mount 31, and the U-shaped guide 33. The U-shaped guide 33 is fixed onto the silicon substrate 21, and the laser sub-mount 31 on which the semiconductor laser device 1 is mounted is fixed to the U-shaped guide 33.

In the optical module (optical apparatus) having the structure described above, the optical distance over which light emitted from the semiconductor optical device travels until the light enters the Si substrate is ensured. However, since the semiconductor laser device 1 is disposed on the lower surface (rear surface) of the laser sub-mount 31, it is difficult to externally connect a wire or any other component to the semiconductor laser device 1. A wire is typically connected to an electrode (pad of electrode) provided on the upper surface of the semiconductor laser device 1 (wire bonding). JP 2014-110257 A, however, does not describe how to achieve electrical connection to an external apparatus. The above description has been made of the case where the semiconductor optical device is an LISEL as an example, but the problem described above is not limited to the case where the semiconductor optical device is an LISEL. The same problem occurs, for example, in a semiconductor optical device in which no lens is integrated, that is, a semiconductor laser and a mirror are integrated on a substrate.

The invention has been made in view of the problem described above, and an object of the invention is to provide an optical module that allows external electrical connection to be readily achieved.

(1) To solve the problem described above, an optical module according the invention includes a semiconductor optical device in which an active layer so located as to be disposed at one side in a thickness direction, an electrode located at the same side where the active layer is located, and a mirror that reflects light having exited out of the active layer toward a side opposite the electrode are monolithically integrated with one another, the semiconductor optical device configured to cause the light to exit through the side opposite the electrode, a sub-mount having a first wiring pattern formed on one surface thereof and on which the semiconductor optical device is surface mounted such that the electrode faces the first wiring pattern, a substrate in which an optical waveguide and a grating coupler for introducing the light into the optical waveguide are formed in a surface layer of the substrate, a spacer so mounted on the substrate apart from the grating coupler, having an upper surface on a side opposite the substrate, and having a second wiring pattern formed on the upper surface, and a wire. The sub-mount is mounted on the spacer. The first wiring pattern on the sub-mount faces part of the second wiring pattern on the spacer and is electrically connected thereto. The second wiring pattern on the spacer includes a pad being disposed in a region exposed from the sub-mount and being bonded to the wire.

(2) In the optical module described in the item 1, the sub-mount may have an electrically conductive layer only on the surface on which the first wiring pattern is formed, and the spacer may have an electrically conductive layer only on the upper surface on which the second wiring pattern is formed.

(3) In the optical module described in the item 1 or 2, the spacer may have a hole that passes through a lower surface facing the substrate and the upper surface, and the semiconductor optical device may be disposed in a space surrounded by an inner surface of the hole.

(4) In the optical module described in the item 3, the spacer may have a shape that seamlessly surrounds the semiconductor optical device.

(5) The optical module described in any one of the items 1 to 4 may further include a temperature adjuster mounted on a surface of the sub-mount, the surface being opposite the surface on which the first wiring pattern is formed.

(6) In the optical module described in the item 5, the temperature adjuster may be mounted on the sub-mount and in an area that overlies the spacer.

(7) In the optical module described in any one of the items 1 to 6, a lens that focuses the light may further be monolithically integrated with the semiconductor optical device.

(8) The optical module described in any one of the items 1 to 7 may further include an isolator that is disposed between the semiconductor optical device and the substrate and prevents return light.

(9) The optical module described in any one of the items 1 to 8 may further include a lens substrate which is disposed between the substrate and the spacer and on which a lens that focuses the light is formed.

The invention provides an optical module that allows external electrical connection to be readily achieved.

BRIEF DESCRIPTION OF THE DRAWINGS

FIG. 1 is a cross-sectional view of an optical module according to a first embodiment of the invention.

DETAILED DESCRIPTION OF THE INVENTION

Figure 2A:
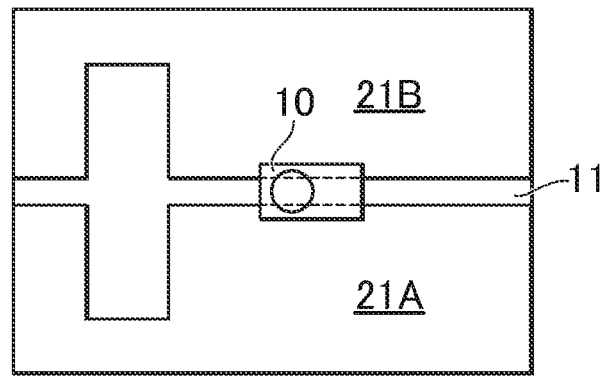
FIG. 2A is a bottom view of a sub-mount according to the first embodiment of the invention.

Embodiments of the invention will be described below in a specific, detailed manner with reference to the drawings. Throughout the drawings for describing the embodiments, members having the same function have the same reference character, and no repetitive description thereof will be made. The following drawings only describe exemplary embodiments, and the sizes of components in the drawings do not necessarily accord with the scales described in the exemplary embodiments.

First Embodiment

FIG. 1 is a cross-sectional view of an optical module 1 according to a first embodiment of the invention. The optical module 1 (optical apparatus) according to the embodiment is an optical module used in optical communication and includes a semiconductor optical device 10, a sub-mount 11, a spacer 12, an Si substrate 13, and a pair of wires 14. The semiconductor optical device 10, the sub-mount 11, and the spacer 12 form a light source. The light source is fixed onto the Si substrate 13 with solder 25.

Pairs of electrodes 20, 21, and 22 are formed on the semiconductor optical device 10, the sub-mount 11, and the spacer 12, which form the light source, respectively, and the pairs of electrodes 20, 21, and 22 are electrically connected to each other in the assembled optical module 1. The pair of wires 14 are connected (wire bonding) to the pair of electrodes 22 formed on an upper surface of the space 12. A primary feature of the embodiment of the invention lies in the configuration of the electrodes formed on each of the semiconductor optical device 10, the sub-mount 11, and the spacer 12.

Figure 2B:
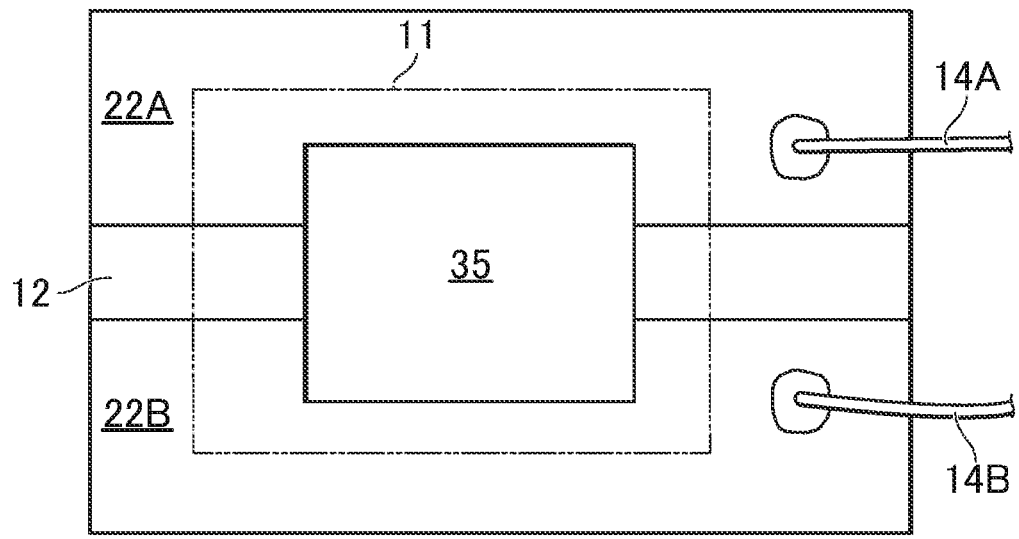
FIG. 2B is a plan view of a spacer according to the first embodiment of the invention.

FIG. 2A is a bottom view of the sub-mount 11 according to the embodiment. A first wiring pattern is formed on a lower surface of the sub-mount 11. The first wiring pattern corresponds to the pair of electrodes 21, and the pair of electrodes 21 are formed of electrodes 21A and 21B. FIG. 2B is a plan view of the spacer 12 according to the embodiment. A second wiring pattern is formed on the upper surface of the spacer 12. The second wiring pattern corresponds to the pair of electrodes 22, and the pair of electrodes 22 are formed of electrodes 22A and 22B. The sub-mount 11 is mounted on the spacer 12, and the first wiring pattern faces part of the second wiring pattern and is electrically connected thereto. That is, the electrode 21A on the sub-mount 11 faces the electrode 22A on the spacer 12 and is electrically connected thereto with solder (not shown), and the electrode 21B on the sub-mount 11 faces the electrode 22B on the spacer 12 and is electrically connected thereto with solder (not shown). The state in which the first wiring pattern and the second wiring pattern face each other means that part of the first wiring pattern and part of the second wiring pattern overlap with each other along the thickness direction of the optical module 1. FIG. 2B shows an area where the sub-mount 11 is disposed in the form of a two-dot chain line in the assembled state. As shown in FIG. 2B, the upper surface of the spacer 12 is broader than the lower surface of the sub-mount 11 and also has an area where the sub-mount 11 is not disposed. The wires are bonded to the area in wire bonding operation. That is, the second wiring pattern on the spacer 12 also has pads which are disposed in a region exposed from the sub-mount 11 and are bonded to the wires, respectively. The pads refer to connection portions where the wires are connected to the second wiring pattern (and portions around the connection portions).

Figure 3:
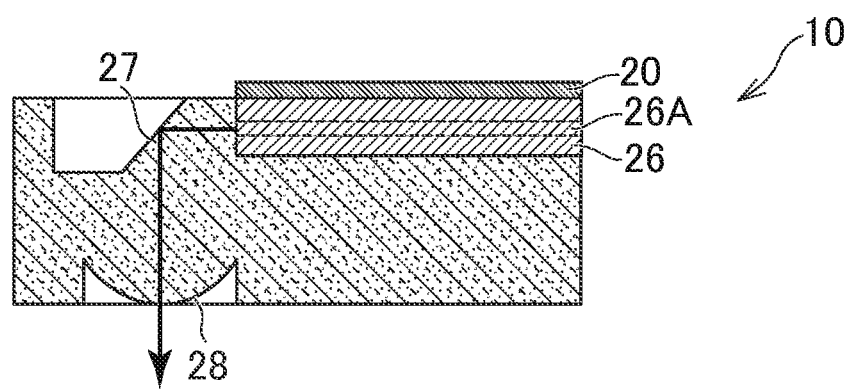
FIG. 3 is a cross-sectional view of a semiconductor optical device according to the first embodiment of the invention.

FIG. 3 is a cross-sectional view of the semiconductor optical device 10 according to the embodiment. The semiconductor optical device 10 according to the embodiment is an LISEL in which a laser section, a mirror 27, and a lens 28 are monolithically integrated on a semiconductor substrate (InP substrate in the embodiment). The laser section has the structure of a DFB laser and emits light that belongs to a 1.3-μm band. The laser section includes a semiconductor multilayer 26, which is layered on the semiconductor substrate, and the pair of electrodes 20. The semiconductor multilayer 26 is layered on the semiconductor substrate along the thickness direction of the semiconductor optical device 10 (layering direction), and the semiconductor multilayer 26 contains an active layer 26A. The active layer 26A is therefore disposed in an upper portion (at one side) in the thickness direction of the semiconductor optical device 10. The pair of electrodes 20 are formed on an upper surface of the semiconductor substrate and located at the same side as the active layer 26A is disposed in the thickness direction. The light is emitted through an output end of the active layer 26A (left side end in FIG. 3) toward interior of the semiconductor optical device 10. That is, the light emitted from the active layer 26A travels in the direction perpendicular to the thickness direction. The mirror 27 is a reflection mirror that reflects the light toward a lower surface of the semiconductor optical device 10 (the side opposite the electrodes 20). The mirror 27 is formed by removal of the semiconductor material located below the upper surface of the semiconductor substrate in such a way that a flat surface inclined with respect to the optical axis of the light emitted from the active layer by about 45 degrees is formed. That is, the mirror 27 is formed of part of an upper surface of the semiconductor optical device 10. The semiconductor optical device 10 is so configured that light reflected off the mirror 27 exits through the lower surface of the semiconductor optical device 10 (the side opposite the electrodes). In the case where the angle between the direction of a normal to the mirror 27 and the optical axis of the light emitted from the active layer 26A is 45 degrees, the direction in which the light exits is parallel to the thickness direction, but the light exiting direction is not necessarily parallel to the thickness direction as long as the light exits through the lower surface of the semiconductor optical device 10.

Since the light that exits from the active layer 26A diverges, the light reflected off the mirror 27 also diverges. Therefore, to focus the light reflected off the mirror 27 and cause the focused light to enter the Si substrate 13, the lens 28 is formed at the lower surface of the semiconductor optical device 10. The lens 28 is a convex lens and is formed by removal of the semiconductor material located above the lower surface of the semiconductor optical device 10 in such a way that a convex curved surface is formed.

As shown in FIGS. 1 and 2A, the semiconductor optical device 10 is mounted on the sub-mount 11 with solder (not shown) in surface mounting operation, and the pair of electrodes 20 face the first wiring pattern (pair of electrodes 21). As shown in FIG. 2A, the electrodes 21A and 21B formed on the lower surface of the sub-mount 11 are so formed as to overlap with part of the upper surface of the semiconductor optical device 10 and be separate from each other.

As shown in FIG. 1, a grating coupler 31 and an optical waveguide 32 are formed in a surface layer (upper layer) of the Si substrate 13 to form an SiP device, and the grating coupler 31 is an optical part for introducing the light emitted by the semiconductor optical device 10 into the optical waveguide 32. The SiP device may further include one or more optical parts downstream of the optical waveguide 32, that is, in downstream positions in the light propagating direction. The surface layer used herein means an upper surface of the Si substrate 13 and a portion in the vicinity of the upper surface. Instead, a portion above the middle point in the thickness direction of the Si substrate (point corresponding to half the thickness) may be defined to be the surface layer. The grating coupler 31 is irradiated with the light emitted by the semiconductor optical device 10, and the light is coupled with the optical waveguide 32. From a viewpoint of improvement in the coupling efficiency, the grating coupler 31 is desirably formed in the surface of the Si substrate 13, and a member may be formed on the grating coupler 31. The optical waveguide 32 is also formed in the surface layer of the Si substrate 13, and a semiconductor layer (cladding layer) is formed on the optical waveguide 32.

The spacer 12 is a support part on which the sub-mount 11 is mounted and is fixed onto the Si substrate 13 with the solder 25. As shown in FIG. 1, the spacer 12 has a hole 35, which passes through a lower surface (surface facing the Si substrate 13) and the upper surface (surface opposite the lower surface) of the spacer 12. In a plan view, the grating coupler 31 falls inside the hole 35. That is, the spacer 12 is so mounted on the Si substrate 13 apart from the grating coupler 31. In the assembled state, the semiconductor optical device 10 is disposed in a space surrounded by an inner surface of the hole 35. The arrangement in which the semiconductor optical device 10 is disposed in the hole 35 ensures that a portion where the sub-mount 11 is connected to the spacer 12 is provided. Further, as shown in FIG. 2B, the hole 35 has a rectangular shape in a plan view along the thickness direction, and the spacer 12 has a shape that seamlessly surrounds the semiconductor optical device 10 in the plan view. The shape of the spacer 12 described above ensures that strength large enough to support the sub-mount 11 is provided and the portion where the sub-mount 11 is connected to the spacer 12 is provided. The spacer 12 does not necessarily have the hollow rectangular shape shown in FIG. 2B and may have any other shape to the extent that strength large enough to support the sub-mount 11 is provided. For example, the spacer 12 may have a U-like shape that is a cut-hole shape that opens in the direction in which the optical waveguide extends.

The configuration of the light source (semiconductor optical device 10, sub-mount 11, and spacer 12) allows each of the pairs of electrodes for conducting current through the laser section of the semiconductor optical device 10 to be formed on the corresponding part and the pair of electrodes to be electrically connected to each other in the assembled state. According to the embodiment of the invention, the wires can be bonded to the light source, and current can therefore be readily applied externally to the laser section of the semiconductor optical device 10. Further, when the light source is fixed to the Si substrate 13 (SiP device), current necessary for active centering (method for optimizing the coupling while the laser section is caused to lase) can be readily applied externally via a probe. Moreover, sufficient electrical connection between the optical parts of the light source can be achieved. Therefore, no wiring pattern (electrically conductive layer) for the electrical connection needs to be provided on a surface of the sub-mount 11 other than the lower surface thereof, and an electrically conductive layer only needs to be provided on the lower surface of the sub-mount 11, whereby the number of manufacturing steps can be reduced. Similarly, no wiring pattern (electrically conductive layer) for the electrical connection needs to be provided on a surface of the spacer 12 other than the upper surface thereof, and an electrically conductive layer only needs to be provided on the upper surface of the spacer 12, whereby the number of manufacturing steps can be further reduced.

A description will be made of the step of assembling the light source. First, the semiconductor optical device 10 is fixed to the lower surface of the sub-mount 11 with solder. Second, the sub-mount 11 on which the semiconductor optical device 10 is mounted is placed on the space 12 with solder in flip-chip mounting operation (upside-down mounting). Solder is used in the embodiment as a fixing agent that connects the parts of the light source to each other, but the fixing agent is not limited to solder and may be an adhesive having electrical conductivity. The sub-mount 11 in FIG. 2A is turned upside down so that the electrodes 21 on the sub-mount 11 faces the electrodes 22 on the spacer 22, and the sub-mount 11 is then fixed to the spacer 12 with solder. As shown in FIG. 2B, in the plan view along the thickness direction, the dimension of the sub-mount 11 is smaller than the dimension of the spacer 12, and the upper surface of the spacer 12 also has the region exposed from the sub-mount 11 so that the region for the pads can be provided. For example, assuming that the dimension of the semiconductor optical device 10 in the plan view is 400 μm×400 μm, the minimum dimension of the hole 35 of the spacer 12 needs to be greater than the dimension of the semiconductor optical device 10, and the thickness of the spacer 12 (width in thickness direction) needs to be greater than the thickness of the semiconductor optical device 10. In the embodiment, the thickness of the spacer 12 is greater than the thickness of the semiconductor optical device 10 by about 150 μm. Further, since the spacer 12 needs to surround outer edge of the sub-mount 11 and support the sub-mount 11, the dimension of the sub-mount 11 needs to be greater than the dimension of the hole 35 of the spacer 12 in the plan view.

Next, consider coupling the optical output from the light source with the SiP device (Si substrate 13). The grating coupler 31 is irradiated with the output light from the semiconductor optical device 10, and the light is coupled with the optical waveguide 32. To this end, when the light source is fixed to the SiP device (Si substrate 13) with the solder 25, the position of the output light needs to coincide with the position of the grating coupler 31. To further increase the coupling efficiency, the mode diameter and the angle of incidence of the light with which the surface of the grating coupler 31 is irradiated are desirably adapted for the mode of the grating coupler. It is desirable to manufacture the parts associated with the coupling under a condition that allows a further increase in the coupling efficiency in consideration of both the design of the lens 28 and the mirror 27 of the semiconductor optical device 10 and the design of the grating coupler 31. In consideration of the precision of processing of the parts, it is typically desirable to design the angle of the mirror to be about 45 degrees. In this case, the output light exits in a direction roughly perpendicular to the lower surface of the semiconductor optical device 10. To determine radius of curvature of the lens, it is important to consider optical distance of a path from the output end of the laser section to the lens 28. The optical distance, which also depends on thickness of the semiconductor optical device 10, can be controlled by wafer polishing. In consideration of expected thickness of the semiconductor optical device 10, distance of the path from the output end of the laser section to the lens 28 ranges from 100 to 200 μm. In consideration of refractive index of the semiconductor material (about 3.2 in the case where the semiconductor material is InP and the output light belongs to the 1.3-μm band) and divergence of the light that exits from the laser section, the expected lens radius for a desired spot diameter on the surface of the grating coupler 31 desirably ranges from 50 to 150 μm. The optimum value of the lens radius depends on design of the grating coupler 31.

Consider now dissipation of heat generated by the semiconductor optical device 10. When the semiconductor optical device 10 is driven, the active layer of the laser section of the semiconductor optical device 10 primarily generates heat. In the embodiment, in which the semiconductor optical device 10 is mounted in flip-chip mounting operation, the active layer is closer to the sub-mount 11 than in other mounting methods, so that excellent heat dissipation is achieved as compared with junction-up mounting in which a semiconductor optical device is mounted by using the surface farther from the active layer. However, since the heat generated by the semiconductor optical device 10 is dissipated through the sub-mount 11 and spacer 12 to the Si substrate 13, the optical module 1 according to the embodiment has a long heat dissipation path structure. Thermal resistance of the optical module 1 therefore increases, and highly efficient heat dissipation is unlikely to be achieved. If no highly efficient heat dissipation is achieved, the temperature of the laser section of the semiconductor optical device 10 increases, possibly resulting in a decrease in the optical output and a decrease in life of the semiconductor optical device 10. The sub-mount 11 is therefore desirably made of a material having high thermal conductivity. Specifically, the sub-mount 11 is desirably made of a ceramic material, such as alumina ($Al_2O_3$) and AlN (aluminum nitride). In a case where the path to the Si substrate 13 is a primary heat dissipation path, the spacer 12 is also desirably made of a material having high thermal conductivity, as the sub-mount 11 is. Further, the fixing agent used to fix the spacer 12 to the Si substrate 13 is the solder 25, and the fixing agent is not limited to the solder 25. In this case, however, it is desirable to use an adhesive having high thermal conductivity.

The invention is optimally applied to a device in which a large number of optical functions are integrated on the Si substrate 13 (SiP device), but the invention is not necessarily applied to an SiP device and may also be applied to a device in which a large number of optical functions integrated on substrate made of any other semiconductor material. Since the optical refractive index n of Si is 3.6, which is a very large value, an optical waveguide 32 can be so formed as to have a small dimension and a small amount of loss by a factor of about no smaller than 10 as compared with optical integration materials of related art (such as quartz, lithium niobate, GaAs, and InP). Further, growth of Ge in Si allows a photodetector to be achieved in the most important wavelength band for optical fiber transmission (1.3-μm band and 1.55-μm band). Moreover, the depletion region of a PN junction used in a diode is so adjusted to be adapted for light propagation, and a high-speed optical phase modulator can be achieved by using the adjusted depletion region. A high-speed optical intensity modulator can therefore be achieved by incorporation of the phase modulation into, for example, a ring resonator or a Mach-Zehnder interferometer. The reason for this is that an SiP technology has shown that a combination of a light modulator, a photo receiver, and the optical waveguide 32 allows an optical circuit in which the number of integrated elements is greater by several digits than the number achieved by using an optical integration material of related art and commercialization of such an optical circuit is underway.

Second Embodiment

Figure 4:
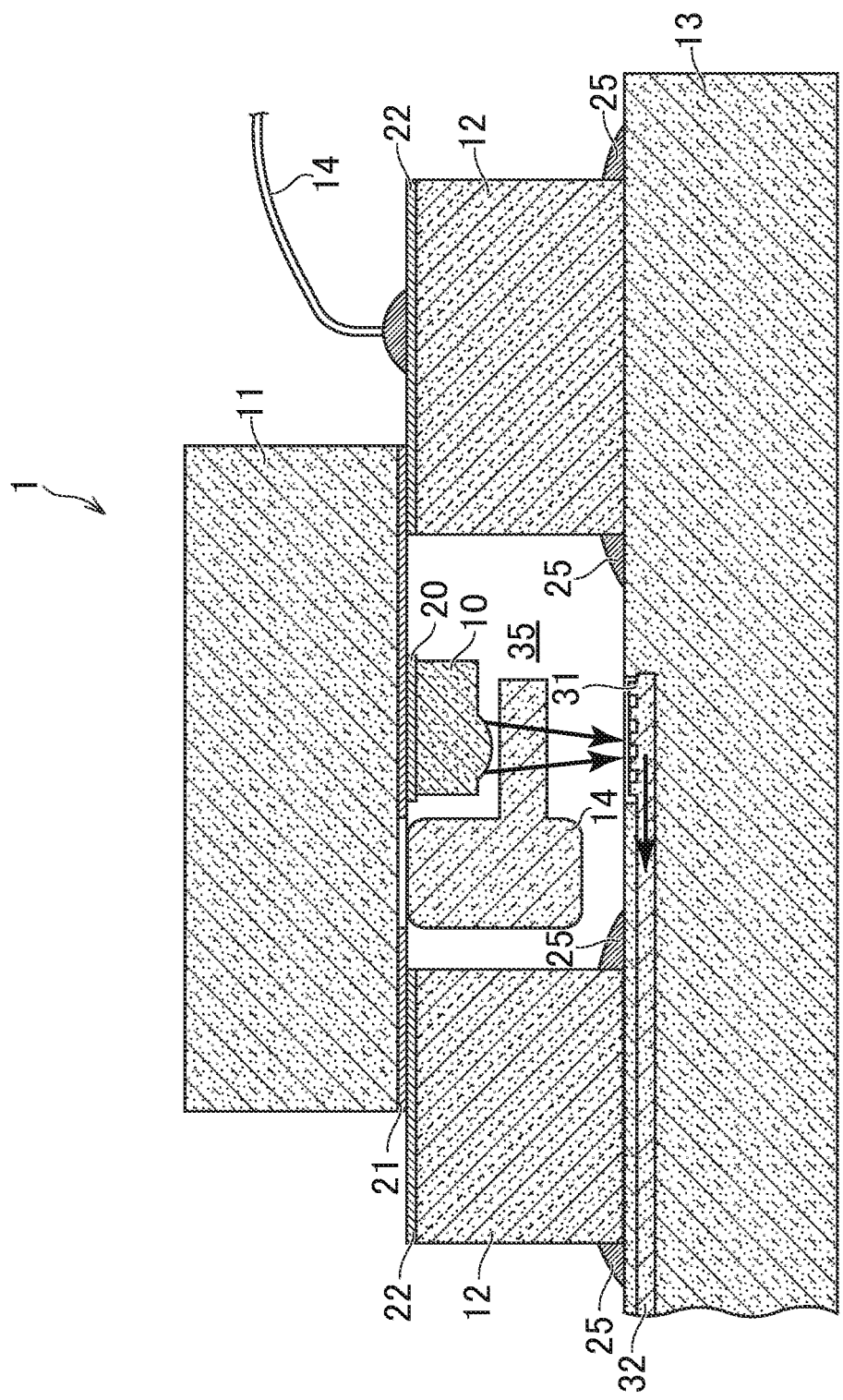
FIG. 4 is a cross-sectional view of an optical module according to a second embodiment of the invention.

FIG. 4 is a cross-sectional view of an optical module 1 according to a second embodiment of the invention. The optical module 1 according to the embodiment has the same structure as that of the optical module 1 according to the first embodiment except that an isolator 14 (optical isolator) is further provided between the semiconductor optical device 10 and the Si substrate 13. The isolator 14 is an optical part for preventing return light from the SiP device and prevents the return light from reaching the semiconductor optical device 10. The optical module 1 according to the embodiment can not only provide the advantageous effects provided by the optical module 1 according to the first embodiment but also prevent unstable action of the semiconductor optical device 10 due to the return light (optical feedback), whereby stable laser oscillation can be achieved for a long period. In the embodiment, the isolator 14 is fixed to the sub-mount 11, but not necessarily, and the isolator 14 may be fixed to the spacer 12 or the Si substrate 13. In any case, the hole 35 of the spacer 12 needs to be so formed as to have a dimension that allows the isolator 14 to be located in the hole 35. Since the dimension of a typically used isolator is about 1 mm×1 mm×1 mm, it is desirable to set the thickness of the spacer 12 to beat least 1 mm. Further, in a plan view of the hole 35 of the spacer 12, the dimension of the hold 35 desirably allows an area having a dimension of 1 mm×1 mm to be provided in addition to the area for the semiconductor optical device 10.

Figure 7:
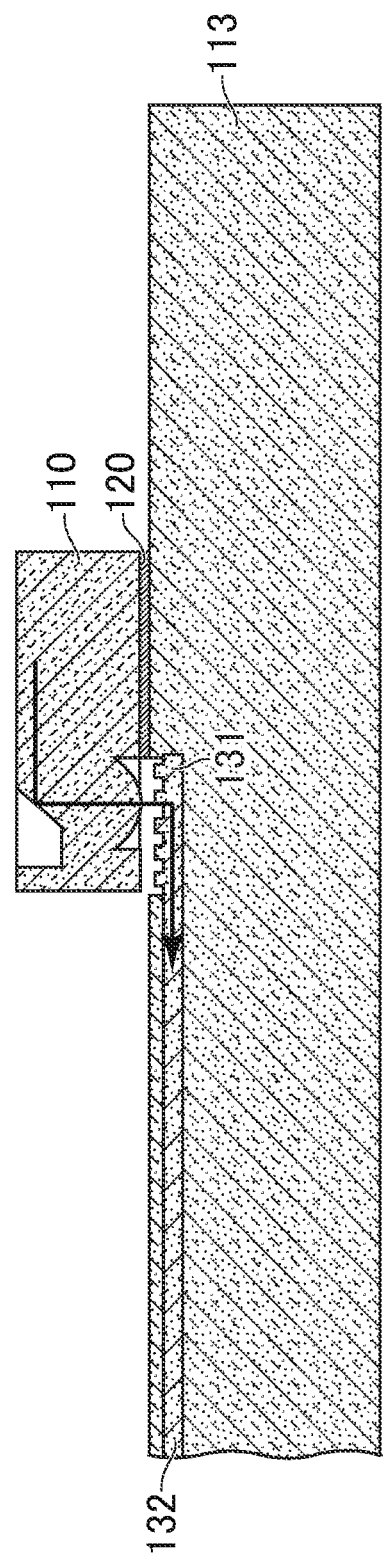
FIG. 7 is a cross-sectional view of an optical module according to Comparative Example of the invention.

As described above, according to the embodiment, the spacer 12 allows a space to be provided between the SiP device and the semiconductor optical device 10, and apart (isolator 14 in the embodiment) can be efficiently disposed in the space. Therefore, according to the invention set forth in the present application, a compact, high-performance optical module can be achieved. To merely ensure the optical distance between the SiP device and the semiconductor optical device, it is conceivable, for example, to sandwich a sub-mount between the semiconductor optical device and the SiP device shown in FIG. 7 and provide a small hole through the sub-mount so that output light from the semiconductor optical device is allowed to pass through the hole. In this case, however, since the semiconductor optical device is mounted in junction-up mounting operation (mounted on surface farther from active layer), excellent heat dissipation is not achieved, and it is difficult to provide another part between the semiconductor optical device and the SiP device.

Third Embodiment

Figure 5:
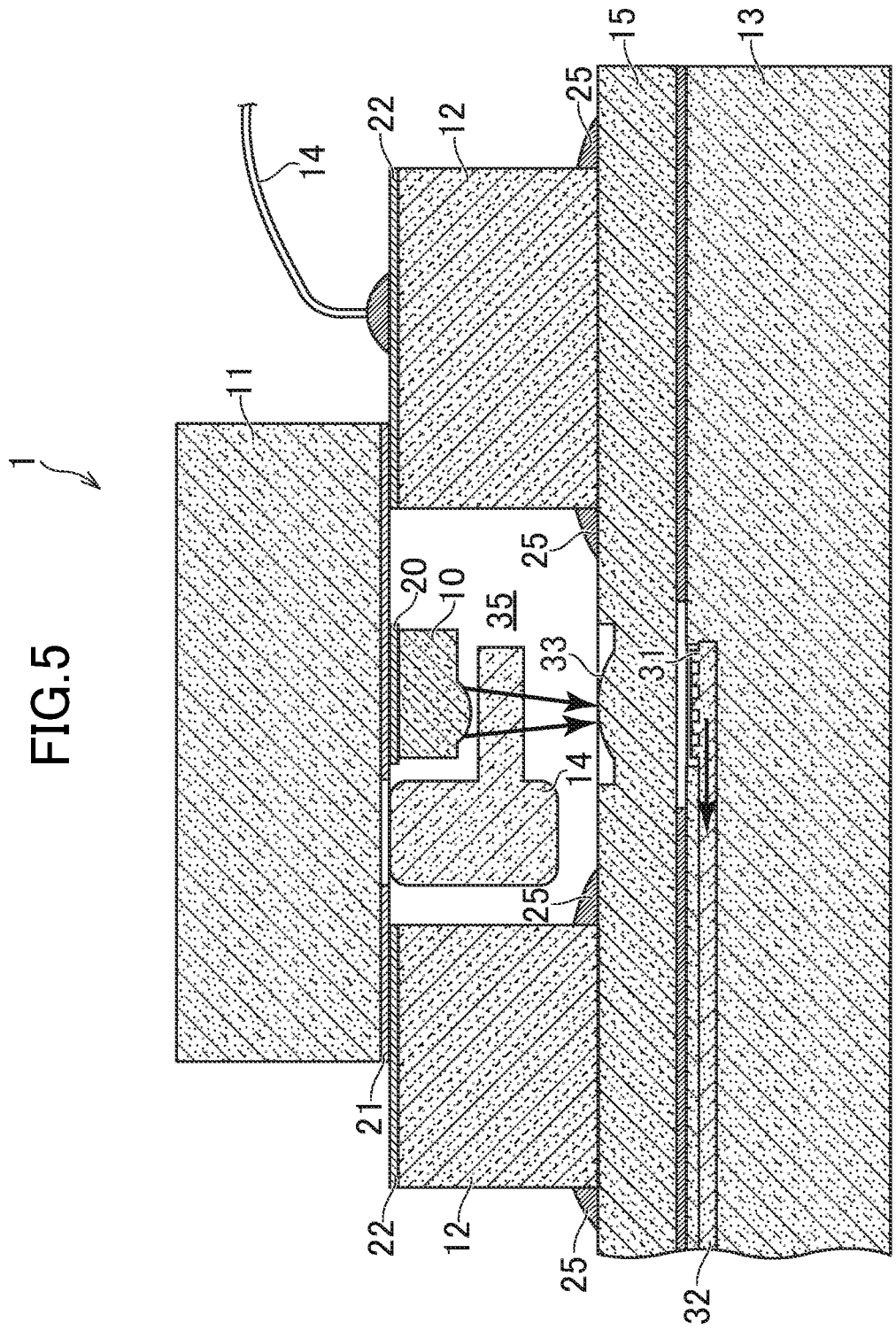
FIG. 5 is a cross-sectional view of an optical module according to a third embodiment of the invention.

FIG. 5 is a cross-sectional view of an optical module 1 according to a third embodiment of the invention. The optical module 1 according to the embodiment has the same structure as that of the optical module 1 according to the first or second embodiment except that a lens substrate 15 is further provided between the spacer 12 and the Si substrate 13. The lens substrate 15 is formed by Silicon. Only the lens 28 formed in the semiconductor optical device 10 may result in difficulty adapting the output light from the semiconductor optical device 10 for the mode of the grating coupler 31 in some cases. In such cases, the coupling efficiency cannot be sufficiently increased. In addition to the advantageous effects provided by the optical module 1 according to the first or second embodiment, the optical module 1 according to the third embodiment allows the mode diameter and the angle of incidence of the light with which the surface of the grating coupler 31 is irradiated to be more readily adapted for the mode of the grating coupler. In the embodiment, the lens 28 of the semiconductor optical device 10 cannot sufficiently focus the output light. In this case, a lens 33 of the lens substrate 15 is desirably a convex lens, but not necessarily, and the lens 33 of the lens substrate 15 may be a concave lens as required. Further, adjustment of the position of the optical axis of the lens 33 of the lens substrate 15 and the position of the optical axis of the output light allows the angle of incidence of the light to be incident on the grating coupler 31 to approach a desired value.

Consider now manufacture of the lens 33. A typically used lens substrate is formed by using a MEMS (micro electro mechanical systems) processing technology to etch a surface of an Si substrate for lens formation. The spot diameter of the light to be incident on the grating coupler 31 further depends on the radius of the lens 33 and the thickness of the lens substrate 15. It is therefore necessary to use a processing technology for precisely controlling the shape and dimension of the lens 33 to be manufactured. However, since the MEMS processing is similar to semiconductor processing and capable of dimensionally precise processing, the MEMS processing technology is desirable. When the lens 33 is formed in the lens substrate 15 shown in FIG. 5, an appropriate shape of the lens 33 and an appropriate thickness of the lens substrate 15 depend on the conditions of the light incident on the lens substrate 15 and the design of the grating coupler 31. For example, assuming that the light incident on the lens substrate 15 is collimated light (parallelized light) having a beam diameter of 50 μm, setting the radius of the lens 33 at 500 μm and the thickness of the lens substrate 15 at 650 μm allows a focused light spot to be produced in the vicinity of the rear surface of the lens substrate 15. The higher the degree of adaptation of the light having exited out of the lens substrate 15 for the mode of the grating coupler, the higher the coupling efficiency.

Fourth Embodiment

Figure 6:
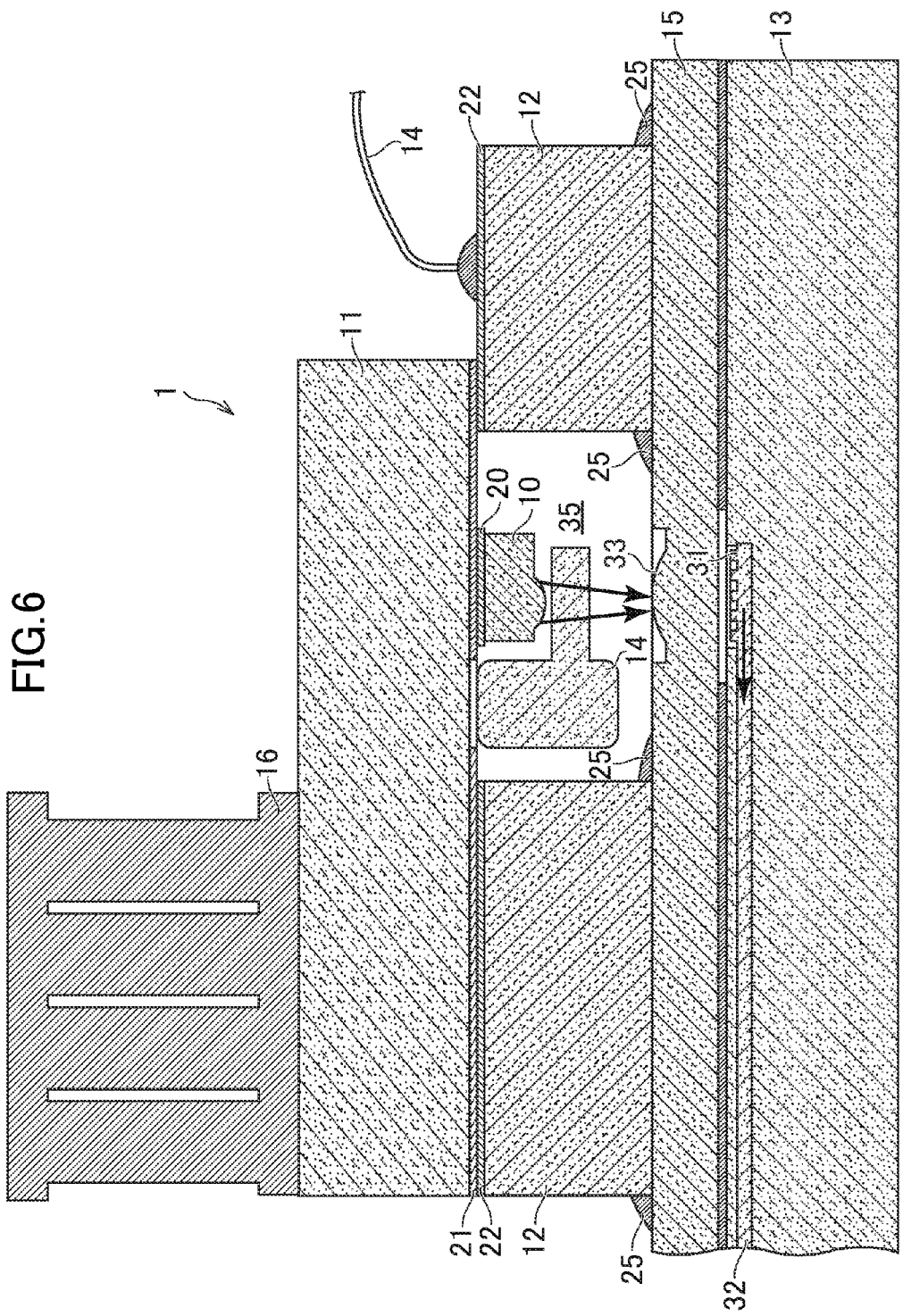
FIG. 6 is a cross-sectional view of an optical module according to a fourth embodiment of the invention.

FIG. 6 is a cross-sectional view of an optical module 1 according to a fourth embodiment of the invention. The optical module 1 according to the embodiment further includes a Peltier device 16 on an upper surface of the sub-mount 11. The optical module 1 according to the embodiment has the same structure as that of the optical module 1 according to any of the first to third embodiments except that the shapes of the sub-mount 11 and the spacer 12 differ from those in the first to third embodiments because the Peltier device 16 is provided on the upper surface of the sub-mount 11. The Peltier device 16 is a temperature adjuster mounted on the upper surface of the sub-mount 11 (the surface opposite the surface on which the first wiring pattern is formed).

As shown in FIG. 6, the Peltier device 16 is disposed on the upper surface of the sub-mount 11. The dimension of the sub-mount 11 and the dimension of the spacer 12 increase accordingly. The Peltier device 16 is mounted on the upper surface of the sub-mount 11 and in an area that overlies the spacer 12 in a plan view. Although the sub-mount 11 supports the Peltier device 16, the weight of the Peltier device 16 induces stress in the sub-mount 11. The resultant strain in the sub-mount 11 influences the semiconductor optical device 10. To suppress the influence, the Peltier device 16 is desirably mounted on the sub-mount 11 and in the area that overlies the spacer 12.

In the case where the path to the Si substrate 13 is a primary heat dissipation path along which the heat generated by the semiconductor optical device 10 is dissipated, the heat dissipation path is long, and sufficient heat dissipation efficiency is not achieved in some cases, as described above. Even in such cases, the optical module 1 according to the embodiment, which includes the Peltier device 16, allows highly efficient heat dissipation.

Further, the SiP device may include a light modulator or a photodetector, and an electric circuit that drives the light modulator or an electric circuit that amplifies the signal from the photodetector is provided in some cases. In such cases, since the SiP device generates heat, the spacer 12 is desirably made of a material having low thermal conductivity. Further, the fixing agent that fixes the spacer 12 onto the Si substrate 13 is desirably an adhesive having lower thermal conductivity. The reason for these is to prevent the heat generated in the SiP device from being transferred to the semiconductor optical device 10. However, in this case, the path to the Si substrate 13 cannot be the heat dissipation path along which the heat generated by the semiconductor optical device 10 is dissipated, but the heat can be dissipated via the sub-mount 11 to the Peltier device 16, whereby highly efficient heat dissipation can be achieved. Therefore, the optical module 1 according to the embodiment allows further suppression of an increase in the temperature of the semiconductor optical device 10 in addition to the advantageous effects provided by the optical module 1 according to any of the first to third embodiments, whereby a decrease in the optical output can be suppressed, and the life of the semiconductor optical device 10 can be prolonged.

The optical modules according to the embodiments of the invention have been described. The laser section of the semiconductor optical device according to each of the embodiments described above has the structure of a DFB laser, and current (voltage) applied to the semiconductor optical device is therefore fixed. The first and second wiring patterns are therefore shaped as shown in FIGS. 2A and 2B, but not necessarily. In a case where the laser section of the semiconductor optical device has the structure of a direct modulation laser, the first and second wiring patterns may have shapes suitable for a signal applied to the direct modulation laser. Further, in the semiconductor optical device according to each of the embodiments described above, a pair of electrodes (p-side electrode and n-side electrode) of the laser section are both formed on the upper surface of the semiconductor optical device. Each of the first and second wiring patterns therefore includes a pair of electrodes. The configuration is, however, not necessarily employed. For example, only one of the pair of electrodes of the laser section may be formed on the upper surface of the semiconductor optical device. Even in this case, the invention is applicable to the connection of the electrode (one of the electrodes). The semiconductor optical device according to each of the embodiments described above is an LISEL in which a lens is integrated, but not necessarily. The semiconductor optical device may include no lens, and the lens substrate 15 or any other optical part may achieve the coupling of light with the Si substrate. In the semiconductor optical device according to each of the embodiments described above, the mirror integrated in the LISEL is inclined by 45 degrees, but not necessarily. The invention is applicable to any case where the mirror is so inclined that the output light travels toward a surface farther from the active layer. The substrate according to each of the embodiments described above is an Si substrate, but not necessarily. The invention is applicable even to a substrate made of another semiconductor material. The optical module according to each of the embodiments described above is an optical module for optical communication using the 1.3-μm band, but not necessarily. The optical module may instead allow optical communication using another wavelength band, for example, the 1.55-μm band or achieve a purpose other than optical communication.

While there have been described what are at present considered to be certain embodiments of the invention, it will be understood that various modifications may be made thereto, and it is intended that the appended claims cover all such modifications as fall within the true spirit and scope of the invention.

What is claimed is:

1. An optical module comprising:
  a semiconductor optical device in which an active layer so located as to be disposed at one side in a thickness direction, an electrode located at the same side where the active layer is located, and a mirror that reflects light having exited out of the active layer toward a side opposite the electrode are monolithically integrated with one another, the semiconductor optical device configured to cause the light to exit through the side opposite the electrode;
  a sub-mount having a first wiring pattern formed on one surface thereof and on which the semiconductor optical device is surface mounted such that the electrode faces the first wiring pattern;
  a substrate in which an optical waveguide and a grating coupler for introducing the light into the optical waveguide are formed in a surface layer of the substrate;
  a spacer so mounted on the substrate apart from the grating coupler, having an upper surface on a side opposite the substrate, and having a second wiring pattern formed on the upper surface; and
a wire,
wherein the sub-mount is mounted on the spacer,
the first wiring pattern on the sub-mount faces part of the second wiring pattern on the spacer and is electrically connected thereto, and
the second wiring pattern on the spacer includes a pad being disposed in a region exposed from the sub-mount and being bonded to the wire.

2. The optical module according to claim 1,
wherein the sub-mount has an electrically conductive layer only on the surface on which the first wiring pattern is formed, and
the spacer has an electrically conductive layer only on the upper surface on which the second wiring pattern is formed.

3. The optical module according to claim 1,
wherein the spacer has a hole that passes through a lower surface facing the substrate and the upper surface, and
the semiconductor optical device is disposed in a space surrounded by an inner surface of the hole.

4. The optical module according to claim 3,
wherein the spacer has a shape that seamlessly surrounds the semiconductor optical device.

5. The optical module according to claim 1,
further comprising a temperature adjuster mounted on a surface of the sub-mount, the surface being opposite the surface on which the first wiring pattern is formed.

6. The optical module according to claim 5,
wherein the temperature adjuster is mounted on the sub-mount and in an area that overlies the spacer.

7. The optical module according to claim 1,
wherein a lens that focuses the light is further monolithically integrated with the semiconductor optical device.

8. The optical module according to claim 1,
further comprising an isolator that is disposed between the semiconductor optical device and the substrate and prevents return light.

9. The optical module according to claim 1,
further comprising a lens substrate which is disposed between the substrate and the spacer and on which a lens that focuses the light is formed.

* * * * *